(12) United States Patent
Fujimoto

(10) Patent No.: US 8,941,186 B2
(45) Date of Patent: Jan. 27, 2015

(54) SEMICONDUCTOR DEVICE HAVING VERTICAL TYPE TRANSISTOR

(75) Inventor: Hiroyuki Fujimoto, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 486 days.

(21) Appl. No.: 13/137,999

(22) Filed: Sep. 23, 2011

(65) Prior Publication Data

US 2012/0080742 A1    Apr. 5, 2012

(30) Foreign Application Priority Data

Oct. 5, 2010   (JP) .................. 2010-225461

(51) Int. Cl.

| H01L 29/08 | (2006.01) |
|---|---|
| H01L 27/108 | (2006.01) |
| G11C 11/404 | (2006.01) |
| G11C 11/408 | (2006.01) |
| H01L 21/8234 | (2006.01) |
| H01L 29/66 | (2006.01) |

(52) U.S. Cl.
CPC ........ *H01L 27/10876* (2013.01); *G11C 11/404* (2013.01); *G11C 11/4085* (2013.01); *H01L 21/823487* (2013.01); *H01L 27/10891* (2013.01); *H01L 29/66666* (2013.01)
USPC .............. 257/401; 257/E21.41; 257/E29.274; 257/E29.262

(58) Field of Classification Search
CPC ................... H01L 29/78642; H01L 29/66666; H01L 29/7827; H01L 29/785; H01L 29/7851; H01L 29/7855; H01L 29/66795

USPC .............. 257/401, E21.41, E29.262, E29.274
See application file for complete search history.

(56) References Cited

U.S. PATENT DOCUMENTS

| 6,744,083 | B2 * | 6/2004 | Chen et al. ..................... 257/219 |
|---|---|---|---|
| 6,943,407 | B2 * | 9/2005 | Ouyang et al. ................ 257/329 |
| 2008/0258209 | A1 | 10/2008 | Oyu | |
| 2009/0085088 | A1 * | 4/2009 | Takaishi ........................ 257/314 |
| 2009/0197379 | A1 * | 8/2009 | Leslie ............................ 438/253 |
| 2010/0213525 | A1 * | 8/2010 | Masuoka et al. .............. 257/306 |
| 2011/0183484 | A1 | 7/2011 | Oyu | |

FOREIGN PATENT DOCUMENTS

| JP | H 03-285352 | 12/1991 |
|---|---|---|
| JP | 2004-274039 A | 9/2004 |
| JP | 2006-147700 A | 6/2006 |
| JP | 2008-140996 A | 6/2008 |
| JP | 2009-088134 A | 4/2009 |

* cited by examiner

*Primary Examiner* — Jerome Jackson, Jr.
*Assistant Examiner* — Paul Budd
(74) *Attorney, Agent, or Firm* — McGinn IP Law Group, PLLC

(57) ABSTRACT

A semiconductor device includes: a first vertical type transistor having a first lower diffusion layer, a first upper diffusion layer, and a gate electrode; a second vertical type transistor having a second lower diffusion layer, a second upper diffusion layer, and a second gate electrode; a gate wiring connected to the first and second gate electrodes; a first wiring connected to the first lower diffusion layer and second upper diffusion layer; and a second wiring connected to the first upper diffusion layer and second lower diffusion layer.

14 Claims, 14 Drawing Sheets

US 8,941,186 B2

SEMICONDUCTOR DEVICE HAVING VERTICAL TYPE TRANSISTOR

BACKGROUND OF THE INVENTION

1. Field of the Invention

The present invention relates to a semiconductor device and, more particularly, to a semiconductor device having a vertical type transistor.

2. Description of Related Art

With the increasing density of a DRAM (Dynamic Random Access Memory), it is becoming difficult to two-dimensionally layout the gate, source, and drain of a MOSFET (Metal Oxide Semiconductor Field Effect Transistor) constituting the DRAM. In particular, when the minimum wiring pitch is not more than 90 nm, the above components need to three-dimensionally be laid out.

The MOSFET having a three-dimensional configuration is a transistor having a semiconductor pillar formed on the surface of a semiconductor substrate, first and second diffusion layers formed at the upper portion and at the lower portion of (or below) the semiconductor pillar, and a gate insulating film and a gate electrode covering the side surface of the semiconductor pillar. One of the first and second diffusion layers serves as the source (S) and the other thereof serves as the drain (D). When such a MOSFET is used as a memory cell transistor of the DRAM, the gate electrode is a word line. In such configured transistor, a channel is formed inside the semiconductor pillar in the vertical direction (normal direction of the semiconductor substrate). Thus, hereinafter, such a MOSFET is referred to as "vertical type transistor".

Japanese Patent Application Laid-Open No. 2008-140996 discloses an example of the vertical type transistor. This vertical type transistor has a pillar body 100e as a semiconductor pillar, upper and lower diffusion layers 107 and 108 formed at the upper portion and below the pillar body 100e, a gate insulating film 106 and a gate electrode 110 formed at the side surface portion of the pillar body 100e. Operation of the vertical type transistor will be described using this example. ON/OFF operation of the vertical type transistor is controlled by the value of voltage applied to the gate electrode 110. When voltage of higher than a threshold value is applied to the gate electrode 110, a channel is formed inside the pillar body 100e to turn ON the vertical type transistor. In an ON state, a charge transfers from one of the upper and lower diffusion layers 107 and 108 to the other one thereof. As a result, drain current flows between the source and drain of the vertical type transistor.

In the semiconductor device, there may be a case where source/drain switching (bias switching) is performed. In a transistor (planar type transistor) in which the gate, source, and drain are two-dimensionally laid out, the magnitude of the drain current does not change before and after the bias switching under normal circumstances; while in the vertical type transistor, the drain current changes before and after the bias switching. This is because the source/drain structure of the vertical type transistor is dissymmetric. A detailed description of this will be given below.

Here, a P-channel type MOS transistor is taken as an example. The magnitude of the drain current of the transistor depends upon the P-type impurity concentration of a source side diffusion layer. This is because the hole density of a channel inversion layer depends upon the P-type impurity concentration of a source side diffusion layer.

In the vertical type transistor, in a forward bias state (state where the drain current flows from the lower diffusion layer to upper diffusion layer), the lower diffusion layer serves as the source side diffusion layer, so that the magnitude of the drain current depends upon the impurity concentration of the lower layer diffusion layer. On the other hand, in a reverse bias state (state where the drain current flows from the upper diffusion layer to lower diffusion layer), the upper diffusion layer serves as the source side diffusion layer, so that the magnitude of the drain current depends upon the impurity concentration of the upper layer diffusion layer.

In the case where a diffusion layer is formed by a typical ion-implantation method, the impurity concentration of the diffusion layer is proportional to the ion-implanted area. In the planer type transistor, it is easy to make the areas of two diffusion layers substantially equal to each other. This can prevent the two diffusion layers from differing in the impurity concentration. On the other hand, in the vertical type transistor, it is difficult to make the dimension of the entire semiconductor pillar constant from the upper to lower portions thereof, so that the area of the upper diffusion layer positioned at the upper portion of the semiconductor pillar and area of the lower diffusion layer positioned at the lower portion of (or below) the semiconductor pillar inevitably differ from each other. This is the reason that the magnitude of the drain current changes before and after the bias switching in the vertical type transistor.

Although the vertical configuration is suitable for some type of the transistor or some purpose, it is likely that the change in the drain current associated with the bias switching is unfavorable. Thus, a vertical type transistor in which the magnitude of the drain current does not change before and after the bias switching is required.

SUMMARY

In one embodiment, there is provided a semiconductor device comprising: first and second semiconductor pillars vertically formed on the upper surface of a semiconductor substrate; a first vertical type transistor including: a first lower diffusion layer formed at the lower portion of or below the first semiconductor pillar; a first upper diffusion layer formed at the upper portion of the first semiconductor pillar; a first gate insulating film covering the side surface portion of the first semiconductor pillar; and a first gate electrode covering the first gate insulating film; a second vertical type transistor including: a second lower diffusion layer formed at the lower portion of or below the second semiconductor pillar; a second upper diffusion layer formed at the upper portion of the second semiconductor pillar; a second gate insulating film covering the side surface portion of the second semiconductor pillar; and a second gate electrode covering the second gate insulating film; a gate wiring connected to the first and second gate electrodes; a first wiring connected to the first lower diffusion layer and second upper diffusion layer; and a second wiring connected to the first upper diffusion layer and second lower diffusion layer.

In another embodiment, there is provided a semiconductor device comprising: first and second semiconductor pillars vertically formed on the upper surface of a semiconductor substrate; a first vertical type transistor including: a first lower diffusion layer formed at the lower portion of or below the first semiconductor pillar; a first upper diffusion layer formed at the upper portion of the first semiconductor pillar; a first gate insulating film covering the side surface portion of the first semiconductor pillar; and a first gate electrode covering the first gate insulating film; a second vertical type transistor including: a second lower diffusion layer formed at the lower portion of or below the second semiconductor pillar; a second upper diffusion layer formed at the upper portion of the second semiconductor pillar; a second gate insulating film covering the side surface portion of the second semiconductor pillar; and a second gate electrode covering the second gate insulating film, wherein the first and second vertical type transistors are connected in parallel between first and second nodes, the first node is connected to the first lower diffusion layer and second upper diffusion layer, and the second node is connected to the first upper diffusion layer and second lower diffusion layer.

In still another embodiment, there is provided a semiconductor device comprising: first and second semiconductor pillars vertically formed on the upper surface of a semiconductor substrate; a first vertical type transistor including: a first lower diffusion layer formed at the lower portion of or below the first semiconductor pillar; a first upper diffusion layer formed at the upper portion of the first semiconductor pillar; a first gate insulating film covering the side surface portion of the first semiconductor pillar; and a first gate electrode covering the first gate insulating film; a second vertical type transistor including: a second lower diffusion layer formed at the lower portion of or below the second semiconductor pillar; a second upper diffusion layer formed at the upper portion of the second semiconductor pillar; a second gate insulating film covering the side surface portion of the second semiconductor pillar; and a second gate electrode covering the second gate insulating film, wherein the first and second vertical type transistors are connected in series between first and second nodes, the first node is connected to the first lower diffusion layer or second upper diffusion layer, and the second node is connected to the second lower diffusion layer when the first node is connected to the first lower diffusion layer and connected to the second upper diffusion layer when the first node is connected to the first upper diffusion layer.

According to the present invention, a change in the drain current of one vertical type transistor due to bias switching is canceled by a change in the drain current of the other vertical type transistor. Thus, it is possible to realize a vertical type transistor in which the magnitude of the drain current does not change before and after the bias switching.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
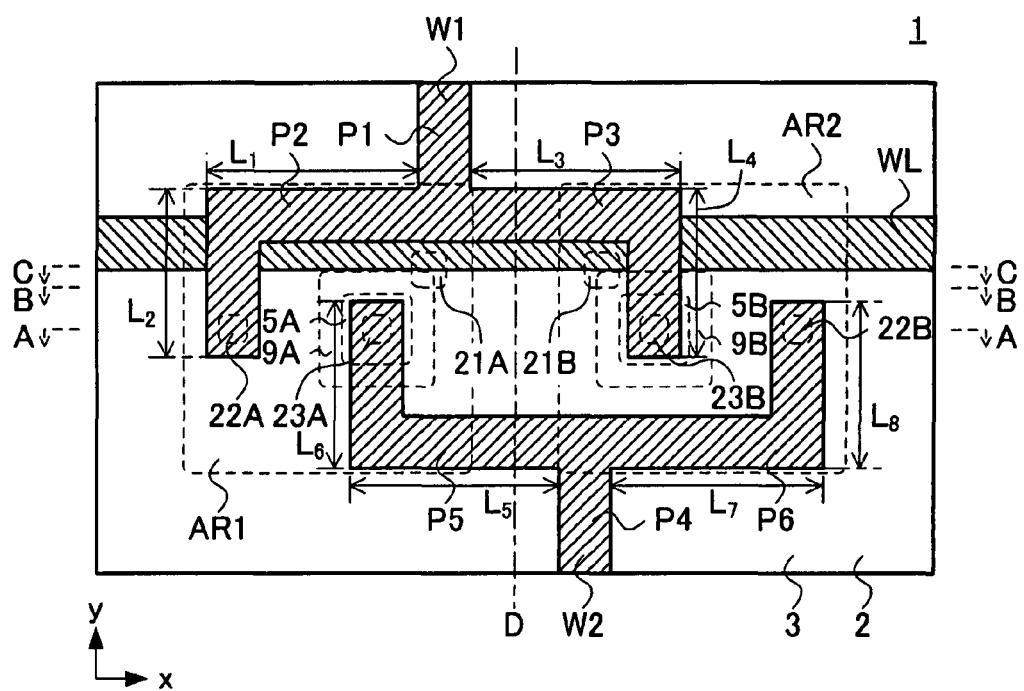
FIG. 1 is a top view of the semiconductor device according to a first preferred embodiment of the present invention.
Figure 2:
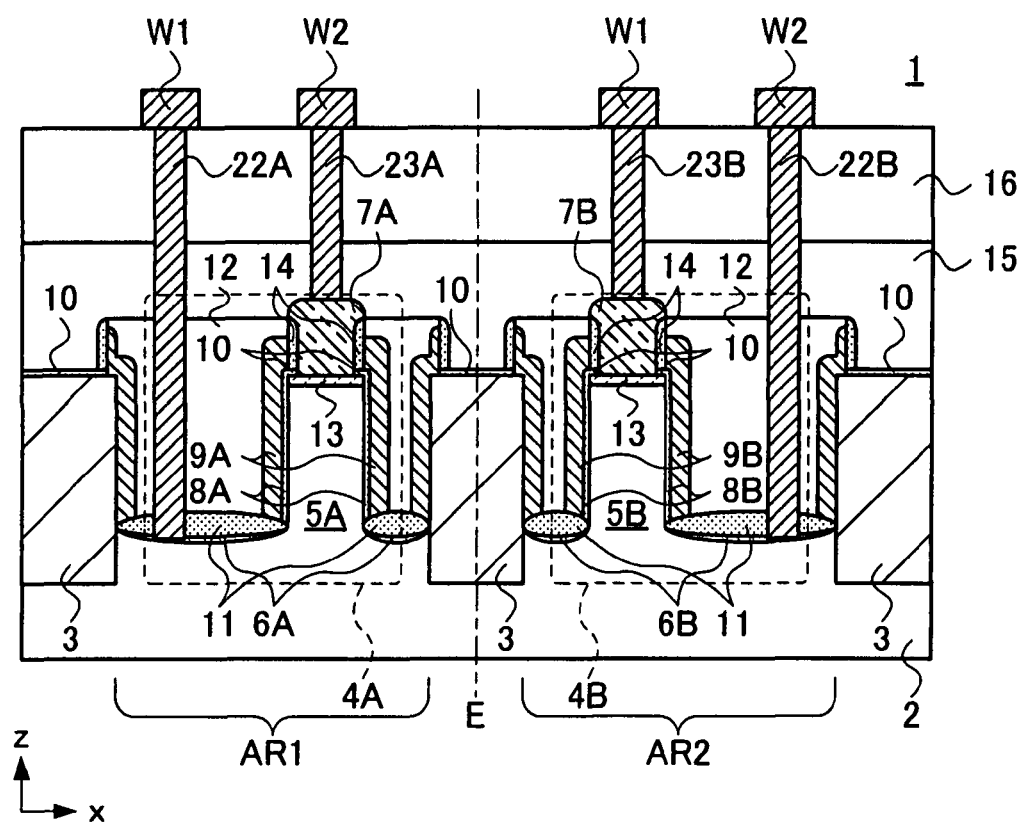
FIGS. 2 to 4 are cross-sectional views of the semiconductor device taken along the line A-A, line B-B, and line C-C of FIG. 1.
Figure 3:
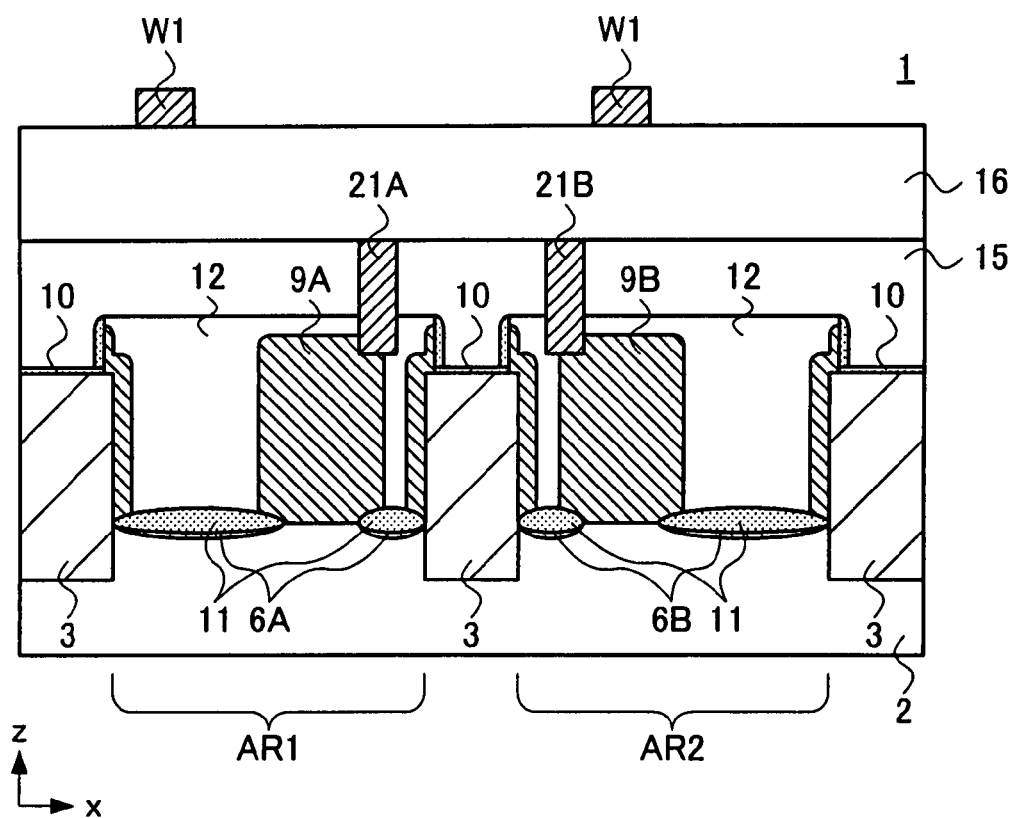
Figure 4:
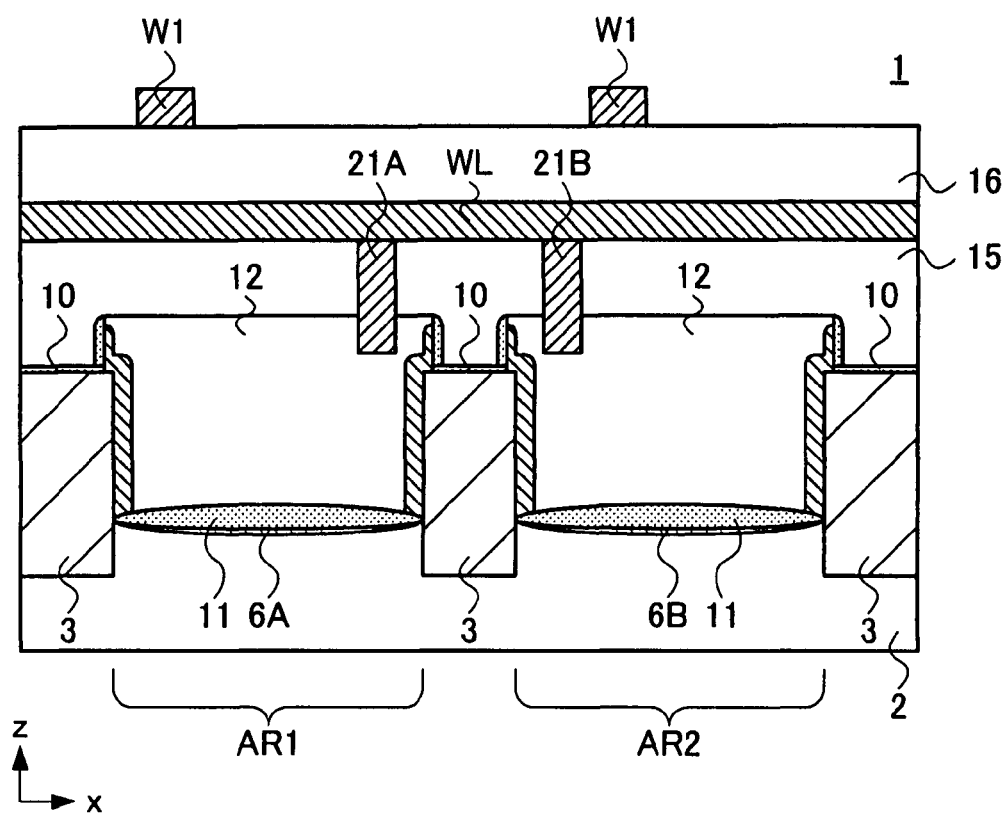

FIGS. 1 to 4 are views each illustrating a structure of a semiconductor device 1 according to a first preferred embodiment of the present invention. FIG. 1 is a top view of the semiconductor device 1 in which a word line WL to be described later is transparently illustrated. Some other internal structures are also transparently illustrated with broken lines so as to allow the two-dimensional positions thereof to be grasped. FIGS. 2 to 4 are cross-sectional views of the semiconductor device 1 taken along the line A-A, line B-B, and line C-C of FIG. 1.

In the following description, it is assumed that the semiconductor device 1 is a DRAM and that first and second vertical type transistors 4A and 4B are used as a memory cell transistor or a word driver. However, the application range of the present invention is not limited to this.

As illustrated in FIGS. 1 to 4, the semiconductor device 1 has a silicon substrate (semiconductor substrate) 2, on the surface of which an element isolation region (Shallow Trench Isolation) 3 is formed. The element isolation region 3 is formed of a silicon oxide film buried in the surface of the silicon substrate 2. By the element isolation region 3, active regions AR1 and AR2 are adjacently defined in x-direction (word line direction) on the surface of the silicon substrate 2.

As illustrated in FIG. 2, first and second vertical type transistors 4A and 4B are provided in the active regions AR1 and AR2, respectively. The first and second vertical type transistors 4A and 4B are formed so as to have the same characteristics. That is, the first and second vertical type transistors 4A and 4B are the same in some characteristics, such as impurity concentration, gate width, and gate length. The first vertical type transistor 4A is symmetrical to the second vertical type transistor 4B with respect to a plane including a straight line D of FIG. 1 and a straight line E of FIG. 2. In the respective drawings, "A" and "B" added to the end of reference numerals denote a component of the first vertical type transistor 4A and a component of the second vertical type transistor 4B, respectively.

The first vertical type transistor 4A has a first silicon pillar (semiconductor pillar) 5A formed inside the active area AR1, a first lower diffusion layer 6A formed below the first silicon pillar 5A, a first upper diffusion layer 7A formed at the upper portion of the first silicon pillar 5A, a first gate insulating film 8A covering the side surface portion of the first silicon pillar 5A, and a first gate electrode 9A covering the first gate insulating film 8A.

Similarly, the second vertical type transistor 4B has a second silicon pillar (semiconductor pillar) 5B formed inside the active area AR2, a second lower diffusion layer 6B formed below the second silicon pillar 5B, a second upper diffusion layer 7B formed at the upper portion of the second silicon pillar 5B, a second gate insulating film 8B covering the side surface portion of the second silicon pillar 5B, and a second gate electrode 9B covering the second gate insulating film 8B.

A formation method of the first vertical type transistor 4A will be described in detail below. Although the following description will be given focusing only the first vertical type transistor 4A, the same can be applied to the second vertical type transistor 4B.

The first silicon pillar 5A is formed as follows. A layered film of a silicon oxide film and a silicon nitride film is formed on the surface of the silicon substrate 2 in which the element isolation region 3 is buried. Then, dry etching is performed using these films as a hard mask to dig the silicon substrate 2 inside the active area AR1 except for a region where the first silicon pillar 5A has been formed. With the above process, the first silicon pillar 5A is formed inside the active area AR1. A silicon oxide film 10 illustrated in FIG. 2 and the like is the silicon oxide film as a part of the hard mask that is left unremoved in the above dry etching.

The planar dimension and height of the first silicon pillar 5A are appropriately set according to characteristics required for the first vertical type transistor 4A. Although not particularly limited, the planar dimension of the first silicon pillar 5A is preferably set to about 70 nm×70 nm. In the case where the planar dimension of the first silicon pillar 5A is preferably set to about 70 nm×70 nm, the height thereof is preferably set to about 150 nm. The film thickness of the silicon oxide film 10 is preferably set to about 5 nm.

The first lower diffusion layer 6A is formed by implanting impurities into the surface (bottom surface) of the active region AR1 after formation of the first silicon pillar 5A. Concretely, after formation of the first silicon pillar 5A, the side surface of the first silicon pillar 5A is covered with a silicon nitride film (not illustrated). Then, thermal oxidation is applied to the bottom surface of the active area AR1 to forma silicon oxide film 11 illustrated in FIG. 2 and the like. Subsequently, impurities having an opposite conductive type to impurities in the silicon substrate 2 is ion-implanted through the silicon oxide film 11. With the above process, the first lower diffusion layer 6A is formed. The silicon nitride film formed on the surface of the first silicon pillar 5A is removed by wet etching after formation of the first lower diffusion layer 6A.

When the above formation method is adopted, the first lower diffusion layer 6A is formed below the first silicon pillar 5A (at the region around the pillar) as illustrated in FIG. 2. However, the formation region of the first lower diffusion layer 6A is not limited to this. For example, the first lower diffusion layer 6A may be formed at the lower portion of the first silicon pillar 5A (inside the pillar).

The first gate electrode film 8A is formed by applying thermal oxidation to the side surface of the first silicon pillar 5A after completion of the wet etching. The film thickness of the gate insulating film 8A is preferably set to about 5 nm.

Then, the first gate electrode 9A is formed. Concretely, a polysilicon film (conductive film) having a film thickness of about 30 nm is formed on the entire surface of the silicon substrate 2 by a CVD (Chemical Vapor Deposition) method, and then anisotropic dry etching is used to etch back the polysilicon film, whereby the first gate electrode 9A is formed. At this time, as illustrated in FIG. 2 and the like, the same conductive film as the abovementioned conductive film is also formed on the side surface of the element isolation region 3; however, this conductive film does not have a particular function. As a material of the first gate electrode 9A, not only the polysilicon film but a metal material such as tungsten may be used.

The first upper diffusion layer 7A is formed by implanting impurities into the upper portion of the first silicon pillar 5A. The term "upper portion" mentioned here corresponds to a silicon epitaxial layer (to be described later) epitaxially grown on the upper surface of the first silicon pillar 5A formed by the above method.

Hereinafter, a formation method of the first upper diffusion layer 7A will be described in detail. After formation of the first gate electrode 9A using the method described above, a silicon oxide film 12 is formed on the entire surface of the silicon substrate 2 by an HDP (High Density Plasma) method, and the surface of the formed silicon oxide film 12 is polished to be flattened by a CMP (Chemical Mechanical Polishing) method. At this time, utilizing the abovementioned hard mask as a stopper enables the upper surface of the silicon oxide film 12 to be aligned with the upper surface of the hard mask. As a result of the series of treatment, the region between the pillars is filled with the silicon oxide film 12.

Subsequently, a silicon oxide film (mask oxide film) (not illustrated) having a thickness of about 5 mm is formed on the entire surface of the silicon substrate 2 by a CVD method. Then, the mask oxide film is patterned so as to expose the hard mask remaining on the first silicon pillar 5A. After that, the exposed portion of the silicon nitride film is removed by dry etching or wet etching. Thus, a through hole is formed above the first silicon pillar 5A, and the silicon oxide film 10 is exposed to the bottom surface of the through hole.

Then, through the silicon oxide film 10 exposed to the bottom surface of the through hole, low concentrated impurities having an opposite conductive type to impurities in the silicon substrate 2 are shallowly ion-implanted into the upper portion of the first silicon pillar 5A. As a result, an LDD (Lightly Doped Drain) region 13 is formed at the upper end portion of the first silicon pillar 5A.

Subsequently, a tubular side wall insulating film 14 is formed on the inner wall surface of the through hole. The side wall insulating film 14 is formed by forming a silicon nitride film on the entire surface of the silicon substrate 2 and then applying etch back to the silicon nitride film. Although not particularly limited, the film thickness of the side wall insulating film 14 is preferably set to about 10 nm. The side wall insulating film 14 is formed for ensuring electrical insulation between the first upper diffusion layer 7A and first gate electrode 9A.

Although there may a case where the same through hole and same side wall insulating film are formed also on the upper surface of the element isolation region 3 by the processing up to this stage as illustrated in FIG. 2 and the like, they do not have any special functions.

After formation of the side wall insulating film 14, the silicon oxide film 10 on the upper surface of the first silicon pillar 5A is removed by rare hydrofluoric acid and, after that, silicon is selectively epitaxially grown in the through hole. Then, high concentrated impurities having an opposite conductive type to impurities in the silicon substrate 2 are shallowly ion-implanted into the formed silicon epitaxial layer. The silicon epitaxial layer thus subjected to the ion implantation becomes the first upper diffusion layer 7A. The diameter of the first upper diffusion layer 7A is smaller than that of the first silicon pillar 5A by the thickness of the side wall insulating film 14.

The details of the formation method of the first vertical type transistor 4A have been described.

The entire surface of the silicon substrate 2 including the first and second vertical type transistors 4A and 4B is covered by an interlayer insulating film 15, and an interlayer insulating film 16 is formed on the interlayer insulating film 15. The interlayer insulating films 15 and 16 may each be formed of a silicon oxide film. Various contact plugs to be described later are formed through the interlayer insulating films 15 and 16. These contact plugs are each formed by forming a through hole penetrating the interlayer insulating film 15 and the like and burying a conductive material such as polysilicon inside the through hole.

As illustrated in FIG. 4, a word line WL (gate wiring) extending in x-direction is formed on the upper surface (between the interlayer insulating films 15 and 16) of the interlayer insulating film 15. As illustrated in FIGS. 1, 3, and 4, the first gate electrode 9A is electrically connected to the word line WL through a gate contact plug 21A penetrating the interlayer insulating film 15. Similarly, the second gate electrode 9B is electrically connected to the word line WL through a gate contact plug 21B penetrating the interlayer insulating film 15. Thus, the first and second gate electrodes 9A and 9B are short-circuited to each other through the word line WL.

As illustrated in FIG. 1, the gate contact plugs 21A and 21B are formed in positions that do not overlap their corresponding silicon pillars as viewed from above. The word line WL is formed, utilizing the widths of the gate contact plugs 21A and 21B, at a position further away from the corresponding silicon pillars as viewed from above and, more concretely, at a position that does not overlap the corresponding gate electrodes as viewed from above. The reason for this is in order to secure electrical insulation between third and fourth contact plugs 23A, 24B to be described later and the word line WL and gate contact plugs 21A, 21B.

As illustrated in FIG. 2, first and second wirings W1 and W2 are formed on the upper surface of the interlayer insulating film 16. The first and second wirings W1 and W2 are arranged so as not to contact each other. Preferably, the first and second wirings W1 and W2 have the same height and width. Although not particularly limited, it is preferable to set the height and width of the first and second wirings W1 and W2 to about 50 nm and about 70 nm, respectively.

The first lower diffusion layer 6A is electrically connected to the first wiring W1 through the first contact plug 22A penetrating the silicon oxide films 11, 12 and interlayer insulating films 15 and 16. The second lower diffusion layer 6B is electrically connected to the second wiring W2 through the second contact plug 22B penetrating the silicon oxide films 11, 12 and interlayer insulating films 15 and 16. The first upper diffusion layer 7A is electrically connected to the second wiring W2 through a third contact plug 23A penetrating the interlayer insulating films 15 and 16. The second upper diffusion layer 7B is electrically connected to the first wiring W1 through a fourth contact plug 23B penetrating the interlayer insulating films 15 and 16.

The two-dimensional arrangement of the first and second wirings W1 and W2 is illustrated in FIG. 1. As illustrated, the first wiring W1 includes: a first partial wiring P1 shared between the first lower diffusion layer 6A and second upper diffusion layer 7B; and second and third partial wirings P2 and P3 extending from the end portion of the first partial wiring P1 to the first and fourth contact plugs 22A and 23B, respectively. The second wiring W2 includes: a fourth partial wiring P4 shared between the first upper diffusion layer 7A and second lower diffusion layer 6B; and fifth and sixth partial wirings P5 and P6 extending from the end portion of the fourth partial wiring 24 to the third and second contact plugs 23A and 22B, respectively.

The second, third, fifth, and sixth partial wirings P2, P3, P5, and P6 each have a right-angle corner portion. The wiring length of each part of the partial wiring is defined as follows. In the second partial wiring P2, the wiring length from the connecting point to the first partial wiring P1 to the corner portion is $L_1$, and wiring length from the corner portion to the connecting point to the first contact plug 22A is $L_2$. In the third partial wiring P3, the wiring length from the connecting point to the first partial wiring P1 to the corner portion is $L_3$, and wiring length from the corner portion to the connecting point to the fourth contact plug 23B is $L_4$. In the fifth partial wiring P5, the wiring length from the connecting point to the fourth partial wiring P4 to the corner portion is $L_5$, and wiring length from the corner portion to the connecting point to the third contact plug 23A is $L_6$. In the sixth partial wiring P6, the wiring length from the connecting point to the fourth partial wiring P4 to the corner portion is $L_7$, and wiring length from the corner portion to the connecting point to the second contact plug 22B is $L_8$. The partial wirings are arranged at least such that wiring length $L_1+L_2$ (wiring length of the second partial wiring P2) and wiring length $L_7+L_8$ (wiring length of the sixth partial wiring P6) are equal to each other and that wiring length $L_3+L_4$ (wiring length of the third partial wiring P3) and wiring length $L_5+L_6$ (wiring length of the fifth partial wiring P5) are equal to each other. More preferably, the partial wirings are arranged such that $L_1$, $L3$, $L5$, and $L7$ are equal to one another and that $L_2$, $L_4$, $L_6$, and $L_8$ are equal to one another.

Figure 5A:
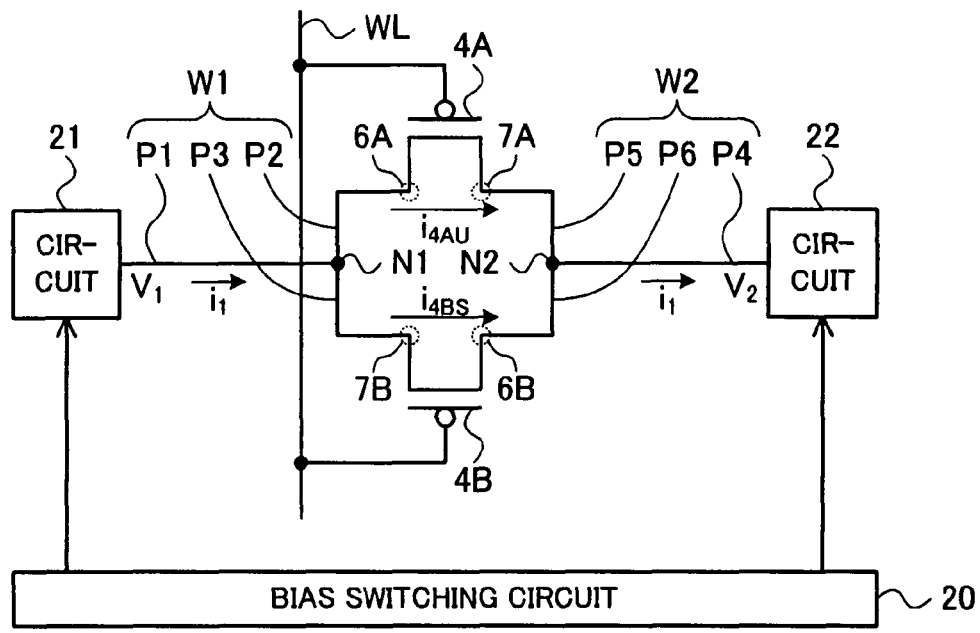
FIGS. 5A and 5B are each a circuit diagram of the semiconductor device according to the first preferred embodiment of the present invention.
Figure 5B:
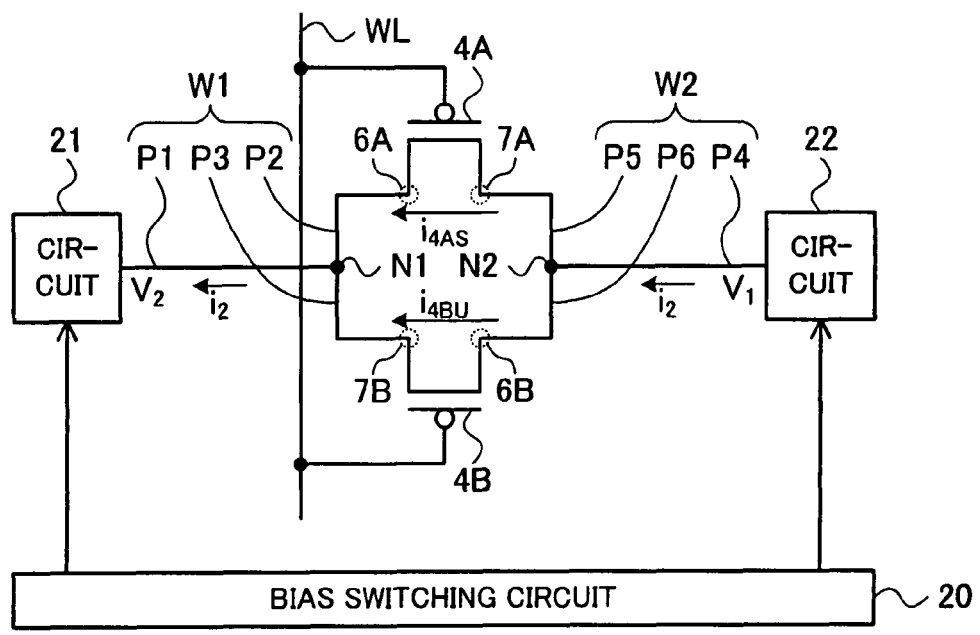

FIGS. 5A and 5B are each a circuit diagram of the semiconductor device 1 according to the present embodiment. FIG. 5A and FIG. 5B are the same in circuit configuration and only differ in voltage and current values. FIG. 5A represents the voltage and current in a first mode to be described later and FIG. 5B represents the voltage and current in a second mode to be described later.

As illustrated in FIGS. 5A and 5B, the semiconductor device 1 includes a bias switching circuit 20 (bias switching means) and first and second circuits 21 and 22. As illustrated, assuming that the connection point among the first, second, and third partial wirings P1, P2, and P3 is a first node N1 and that the connection point among the fourth, fifth, and sixth partial wirings P4, P5, and P6 is a second node N2, the first partial wiring P1 is a wiring connecting the first node N1 and first circuit 21, and fourth partial wiring P4 is a wiring connecting the second node N2 and second circuit 22. The first and second vertical type transistors 4A and 4B are connected in parallel to each other between the first and second nodes N1 and N2.

Although the first and second vertical type transistors 4A and 4B are P-channel type MOS transistors in FIGS. 5A and 5B, the present embodiment may be applied to a case where the first and second vertical type transistors 4A and 4B are other type transistors such as an N-channel type MOS transistor or an MIS (Metal-Insulator Semiconductor) transistor. The following description will be made on the assumption that the first and second vertical type transistors 4A and 4B are P-channel type MOS transistors.

The first and second circuits 21 and 22 operate in one of first and second modes.

As illustrated in FIG. 5A, in the first mode, the output voltage (voltage applied to the first node N1) of the first circuit 21 is set to relatively high voltage $V_1$ and output voltage (voltage applied to the second node N2) of the second circuit 22 is set to relatively low voltage $V_2$. In this case, when voltage causing the first and second vertical type transistors 4A and 4B to turn ON is applied to the word line WL, upward drain current $i_{4AU}$ flows in the first vertical type transistor 4A from the first lower diffusion layer 6A toward the first upper diffusion layer 7A, and downward drain current $i_{4BS}$ flows in the second vertical type transistor 4B from the second upper diffusion layer 7B toward the second lower diffusion layer 6B. Thus, assuming that current output from the first circuit 21 (current to be input to the second circuit 22) is $i_1$, $i_1 = i_{4AU} + i_{4BS}$ is satisfied.

As illustrated in FIG. 5B, in the second mode, the output voltage of the first circuit 21 is set to relatively low voltage $V_2$ and output voltage of the second circuit 22 is set to relatively high voltage $V_1$. In this case, when voltage causing the first and second vertical type transistors 4A and 4B to turn ON is applied to the word line WL, downward drain current $i_{4AS}$ flows in the first vertical type transistor 4A from the first upper diffusion layer 7A toward the first lower diffusion layer 6A, and upward drain current $i_{4BU}$ flows in the second vertical type transistor 4B from the second lower diffusion layer 6B toward the second upper diffusion layer 7B. Thus, assuming that current output from the second circuit 22 (current to be input to the first circuit 21) is $i_2$, $i_2 = i_{4AS} + i_{4BU}$ is satisfied.

As described above, the first and second vertical type transistors 4A and 4B is formed so as to have the same characteristics. Thus, the upward drain current $i_{4AU}$ in the first vertical type transistor 4A and upward drain current $i_{4BU}$ of the second vertical type transistor 4B are equal to each other. Similarly, the downward drain current $i_{4AS}$ in the first vertical type transistor 4A and downward drain current $i_{4BS}$ of the second vertical type transistor 4B are equal to each other. Thus, in the semiconductor device 1, the current $i_1$ and current $i_2$ are equal to each other.

The bias switching circuit 20 is connected to the first and second circuits 21 and 22 and has a function of switching between the first and second modes. In the semiconductor device 1, the current $i_1$ and current $i_2$ are equal to each other as described above. Therefore, the magnitude of the current flowing between the first and second circuits 21 and 22 does not change before and after the mode switching (bias switching) by the bias switching circuit 20.

As described above, according to the semiconductor device 1 of the present embodiment, the magnitude of the current flowing between the first and second circuits 21 and 22 does not change before and after the bias switching. The first and second vertical type transistor 4A and 4B function as "one transistor" as viewed from outside, and current $i_1$ and current $i_2$ function as the drain current of the "one transistor". Thus, there can be provided a vertical type transistor in which the magnitude of the current does not change before and after the bias switching.

Further, the wiring lengths of the second and third partial wirings P2 and P3 are made equal to each other, and wiring lengths of the fifth and sixth partial wirings P5 and P6 are made equal to each other. Therefore, the wiring resistance of the wiring from the first circuit 21 to the second circuit 22 is the same in the route passing through the first vertical type transistor 4A and route passing through the second vertical type transistor 4B. As a result, the amount of current loss due to the wiring resistance is the same before and after the bias switching, thereby further reducing the difference between the values of the drain currents before and after the bias switching.

Figure 6:
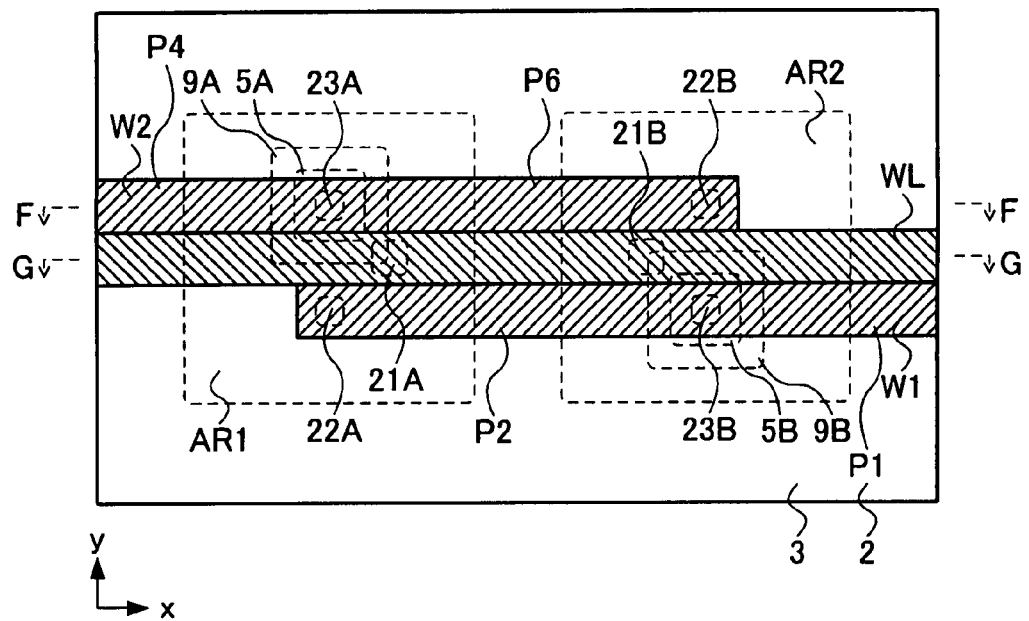
FIG. 6 is a top view of the semiconductor device according to a second preferred embodiment of the present invention.
Figure 7:
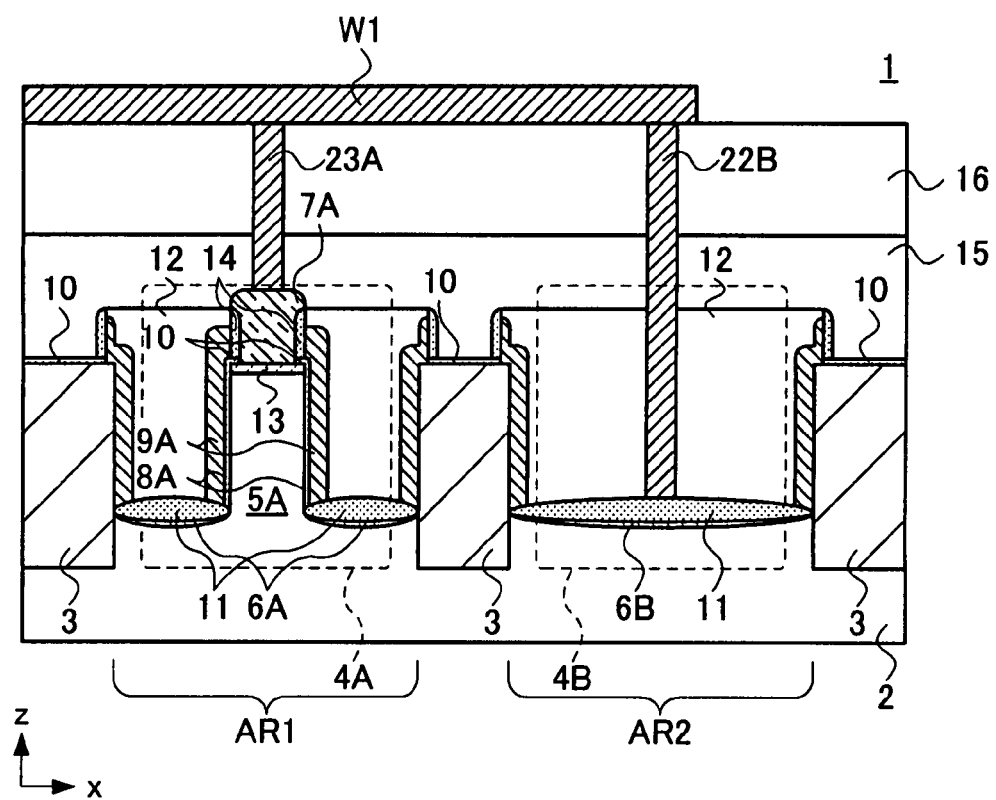
FIGS. 7 and 8 are cross-sectional views of the semiconductor device taken along the line F-F and line G-G of FIG. 6.
Figure 8:
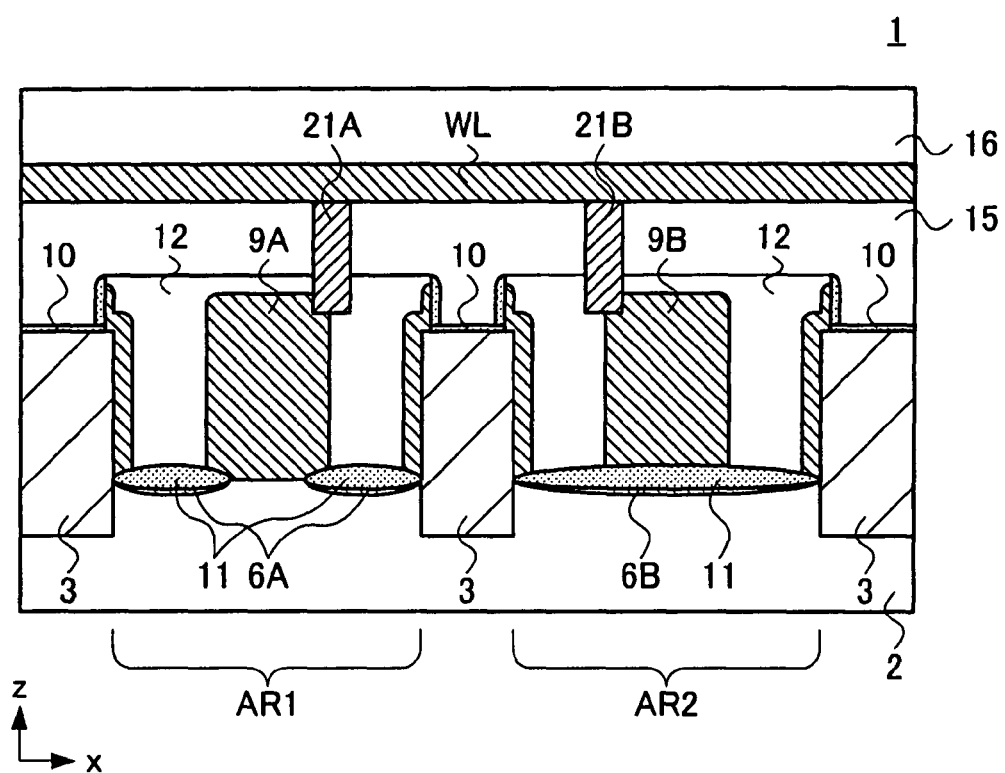

FIGS. 6 to 8 are views each illustrating a structure of the semiconductor device 1 according to a second preferred embodiment of the present invention. FIG. 6 is a top view of the semiconductor device 1 in which the word line WL is transparently illustrated as in the case of FIG. 1. Some other internal structures are also transparently illustrated with broken lines. FIGS. 7 and 8 are cross-sectional views of the semiconductor device 1 taken along the line F-F and line G-G of FIG. 6. In FIGS. 6 to 8, the same reference numerals are given to the same elements of the semiconductor device 1 according to the first embodiment.

The semiconductor device 1 according to the present embodiment differs from the semiconductor device 1 of the first embodiment in that the y-direction (direction perpendicular to the word line extending direction in a plane) positions of the first and second silicon pillars 5A and 5B are displaced from each other whereas the positions of the active areas AR1 and AR2 are the same as those in the semiconductor device 1 according to the first embodiment. Accordingly, the positions of the contact plugs and arrangements of the first and second wirings W1 and W2 and word line WL are different from those in the semiconductor device 1 according to the first embodiment. The following description will be made focusing on the different points.

As illustrated in FIG. 6, the first silicon pillar 5A is formed in the active region AR1 at the center thereof in x-direction and on one side (upper side of the drawing) thereof in y-direction. Similarly, the third contact plug 23A formed just above the first silicon pillar 5A is formed in the active region AR1 at the center thereof in x-direction and on the one side thereof in y-direction. The first contact plug 22A is formed in the active region AR1 at the center thereof in x-direction and on the other side (lower side of the drawing) thereof in y-direction. The gate contact plug 21A is formed at a position between the first and third contact plugs 22A and 23A as viewed in y-direction and not overlapping the first silicon pillar 5A as viewed from above.

As illustrated in FIG. 6, the second silicon pillar 5B is formed in the active region AR2 at the center thereof in x-direction and on the other side (lower side of the drawing) thereof in y-direction. Similarly, the fourth contact plug 23B formed just above the second silicon pillar 5B is formed in the active region AR2 at the center thereof in x-direction and on the other side thereof in y-direction. The second contact plug 22B is formed in the active region AR2 at the center thereof in x-direction and on the one side (upper side of the drawing) thereof in y-direction. The gate contact plug 21B is formed at a position between the second and fourth contact plugs 22B and 23B as viewed in y-direction and not overlapping the second silicon pillar 5B as viewed from above.

The first and fourth contact plugs 22A and 23B are arranged in the same position in y-direction. Similarly, the second and third contact plugs 22B and 23A are arranged in the same position in y-direction. In addition, the gate contact plugs 21A and 21B are arranged in the same position in y-direction.

The first wiring W1 is a linear wiring contacting, at one end thereof, the first contact plug 22A and extending from the one end to one side (right side in the drawing) in x-direction. The other end of the first wiring W1 is connected to the first circuit 21 of FIG. 5. Since the y-direction positions of the first and fourth contact plugs 22A and 23B are the same, the first wiring W1 contacts also the fourth contact plug 23B. A part of the first wiring W1 that extends between the first contact plug 22A and fourth contact plug 23B corresponds to the above mentioned second partial wiring P2, and the remaining part thereof corresponds to the first partial wiring P1. A portion corresponding to the third partial wiring P3 does not exist in the first wiring W1 according to the present embodiment.

The second wiring W2 is a linear wiring contacting, at one end thereof, the second contact plug 22B and extending from the one end to the other side (left side in the drawing) in x-direction. The other end of the second wiring W2 is connected to the second circuit 22 of FIG. 5. Since the y-direction positions of the second and third contact plugs 22B and 23A are the same, the second wiring W2 contacts also the third contact plug 23A. A part of the second wiring W2 that extends between the second contact plug 22B and third contact plug 23A corresponds to the above mentioned sixth partial wiring P6, and the remaining part thereof corresponds to the fourth partial wiring P4. A portion corresponding to the fifth partial wiring P5 does not exist in the second wiring W2 according to the present embodiment.

The word line WL is arranged between the first and second wirings W1 and W2 as viewed from above. It seems that the word line WL contact the first and second wirings W1 and W2 in FIG. 6; however, as is clear from FIGS. 7 and 8, they are shifted from one another in z-direction, so that they do not actually contact one another.

With the configuration described above, the circuit diagram of the semiconductor device 1 of the present embodiment is the same as that of the semiconductor device 1 of the first embodiment. Thus, as in the case of the semiconductor device 1 of the first embodiment, the magnitude of the current flowing between the first and second circuits 21 and 22 does not change before and after the bias switching. This allows a vertical type transistor in which the magnitude of the drain current does not change before and after the bias switching to be provided.

Further, the wiring lengths of the second and sixth partial wirings P2 and P6 are equal to each other, and the wiring lengths of the third and fifth partial wirings P3 and P5 are each zero. Therefore, the wiring resistance of the wiring from the first circuit 21 to the second circuit 22 is the same in the route passing through the first vertical type transistor 4A and route passing through the second vertical type transistor 4B. As a result, the amount of current loss due to the wiring resistance is the same before and after the bias switching, thereby further reducing the difference between the values of the drain currents before and after the bias switching.

Figure 9:
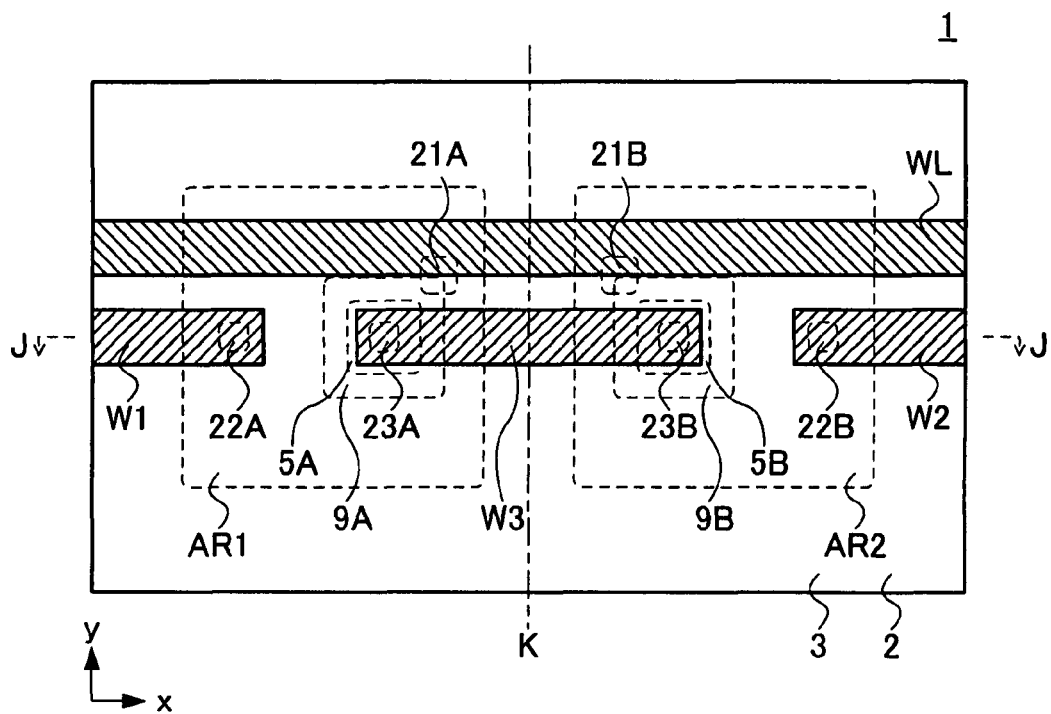
FIG. 9 is a top view of the semiconductor device according to a third preferred embodiment of the present invention.
Figure 10:
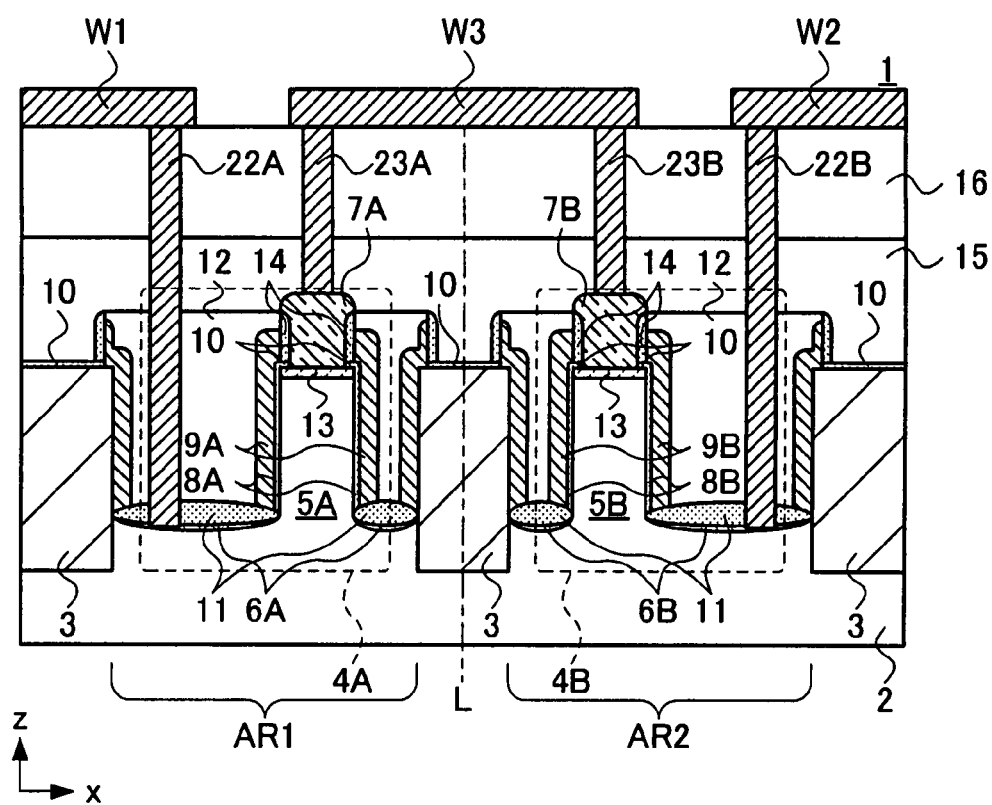
FIG. 10 is a cross-sectional view of the semiconductor device taken along the line J-J of FIG. 9.

FIGS. 9 and 10 are views each illustrating a structure of the semiconductor device 1 according to a third preferred embodiment of the present invention. FIG. 9 is a top view of the semiconductor device 1 in which the word line WL is transparently illustrated as in the case of FIG. 1. Some other internal structures are also transparently illustrated with broken lines. FIG. 10 is a cross-sectional view of the semiconductor device 1 taken along the line J-J of FIG. 9. In FIGS. 9 and 10, the same reference numerals are given to the same elements of the semiconductor device 1 according to the first embodiment.

The semiconductor device 1 according to the present embodiment differs from the semiconductor device 1 of the first embodiment in that the first and second vertical type transistors 4A and 4B are connected in series between the first and second nodes N1 and N2. The structures of the first and second vertical type transistors 4A and 4B are the same as those in the semiconductor device 1 of the first embodiment. The following description will be made focusing on the different points.

In the present embodiment, as illustrated in FIGS. 9 and 10, first to third wirings W1 to W3 are formed on the upper surface of the interlayer insulating film 16. The first to third wirings W1 to W3 are arranged so as not to contact one another. Preferably, the first to third wirings W1 to W3 have the same height and width. Although not particularly limited, it is preferable to set the height and width of the first to third wirings W1 to W3 to about 50 nm and about 70 nm, respectively.

The first wiring W1 is a linear wiring contacting, at one end thereof, the first contact plug 22A and extending from the one end to the other side (left side in the drawing) in x-direction. The second wiring W2 is a linear wiring contacting, at one end thereof, the second contact plug 22B and extending from the one end to the one side (right side in the drawing) in x-direction. The third wiring W3 is a linear wiring contacting, at one end thereof, the third contact plug 23A and contacting, at the other end thereof, the fourth contact plug 23B.

Figure 11A:
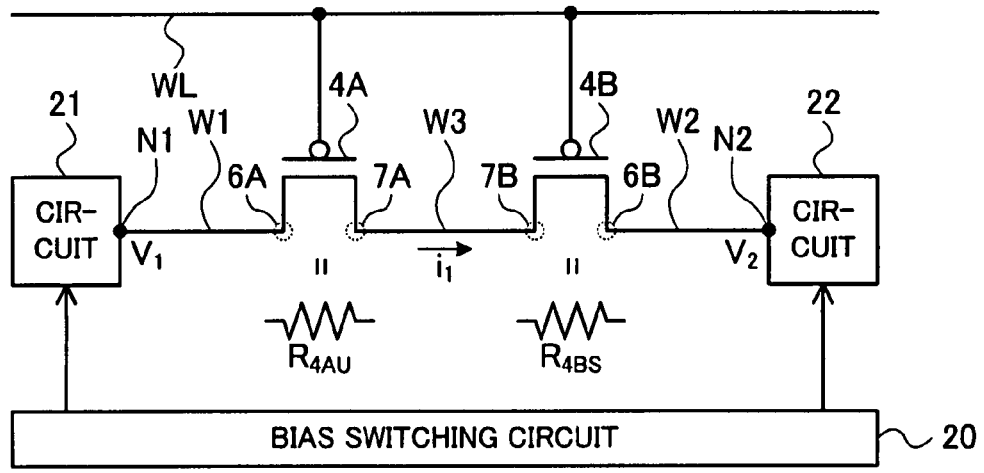
FIGS. 11A and 11B are each a circuit diagram of the semiconductor device according to the third preferred embodiment of the present invention.
Figure 11B:
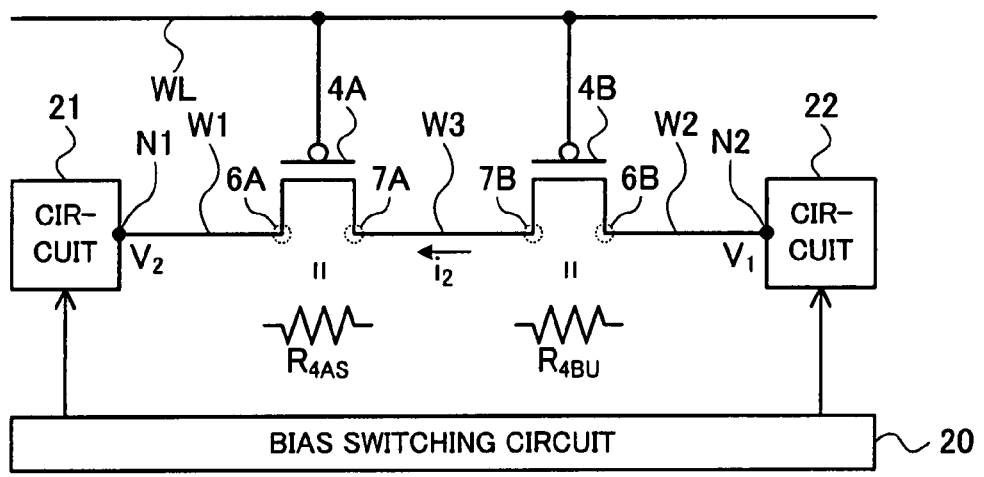

FIGS. 11A and 11B are each a circuit diagram of the semiconductor device 1 according to the present embodiment. FIG. 11A and FIG. 11B are the same in circuit configuration and only differ in voltage and current values. FIG. 11A represents the voltage and current in the abovementioned first mode and FIG. 11B represents the voltage and current in the abovementioned second mode.

In the present embodiment, as illustrated in FIGS. 11A and 11B, the output ends of the first and second circuits 21 and 22 are set to the first and second nodes N1 and N2, respectively. The first and second vertical type transistors 4A and 4B are connected in series between the first and second nodes N1 and N2 through the first to third wirings W1 to W3.

Although the first and second vertical type transistors 4A and 4B are P-channel type MOS transistors as in the case of FIGS. 5A and 5B, the present invention may be applied to a case where the first and second vertical type transistors 4A and 4B are other type transistors such as an N-channel type MOS transistor or an MIS (Metal-Insulator Semiconductor) transistor as in the case of the first embodiment. The following description will be made on the assumption that the first and second vertical type transistors 4A and 4B are P-channel type MOS transistors.

In the first mode in which the output voltage (voltage applied to the first node N1) of the first circuit 21 is set to relatively high voltage $V_1$ and output voltage (voltage applied to the second node N2) of the second circuit 22 is set to relatively low voltage $V_2$, when voltage causing the first and second vertical type transistors 4A and 4B to turn ON is applied to the word line WL, current $i_1$ flows from the first node N1 to second node N2. In the first vertical type transistor 4A, the current $i_1$ flows upward from the first lower diffusion layer 6A toward the first upper diffusion layer 7A, while in the second vertical type transistor 4B, the current $i_1$ flows downward from the second upper diffusion layer 7B toward the second lower diffusion layer 6B.

Assuming that the ON resistance of the first vertical type transistor 4A when the drain current flows upward is $R_{4AU}$ and that the ON resistance of the second vertical type transistor 4B when the drain current flows downward is $R_{4BS}$, the current $i_1$ is equal to a value obtained by $(V_1-V_2)/(R_{4AU}+R_{4BS})$. Here, the wiring resistance is ignored.

In the second mode in which the output voltage of the first circuit 21 is set to relatively low voltage $V_2$ and output voltage of the second circuit 22 is set to relatively high voltage $V_1$, when voltage causing the first and second vertical type transistors 4A and 4B to turn ON is applied to the word line WL, current $i_2$ flows from the second node N2 to first node N1. In the second vertical type transistor 4B, the current $i_2$ flows upward from the second lower diffusion layer 6B toward the second upper diffusion layer 7B, while in the first vertical type transistor 4A, the current $i_1$ flows downward from the first upper diffusion layer 7A toward the first lower diffusion layer 6A.

Assuming that the ON resistance of the first vertical type transistor 4A when the drain current flows downward is $R_{4AS}$ and that the ON resistance of the second vertical type transistor 4B when the drain current flows upward is $R_{4BU}$, the current $i_2$ is equal to a value obtained by $(V_1-V_2)/(R_{4AS}+R_{4BU})$. Also in this case, the wiring resistance is ignored.

As described above, the first and second vertical type transistors 4A and 4B have the same characteristics. Thus, the ON resistance $R_{4AU}$ is equal to the ON resistance $R_{4BU}$, and ON resistance $R_{4AS}$ is equal to the ON resistance $R_{4BS}$. Therefore, the current $i_1$ and current $i_2$ are equal to each other according to the above expressions.

As described above, also in the semiconductor device 1 according to the present embodiment, the magnitude of the current flowing between the first and second circuits 21 and 22 does not change before and after the bias switching. This allows a vertical type transistor in which the magnitude of the drain current does not change before and after the bias switching to be provided.

Figure 12:
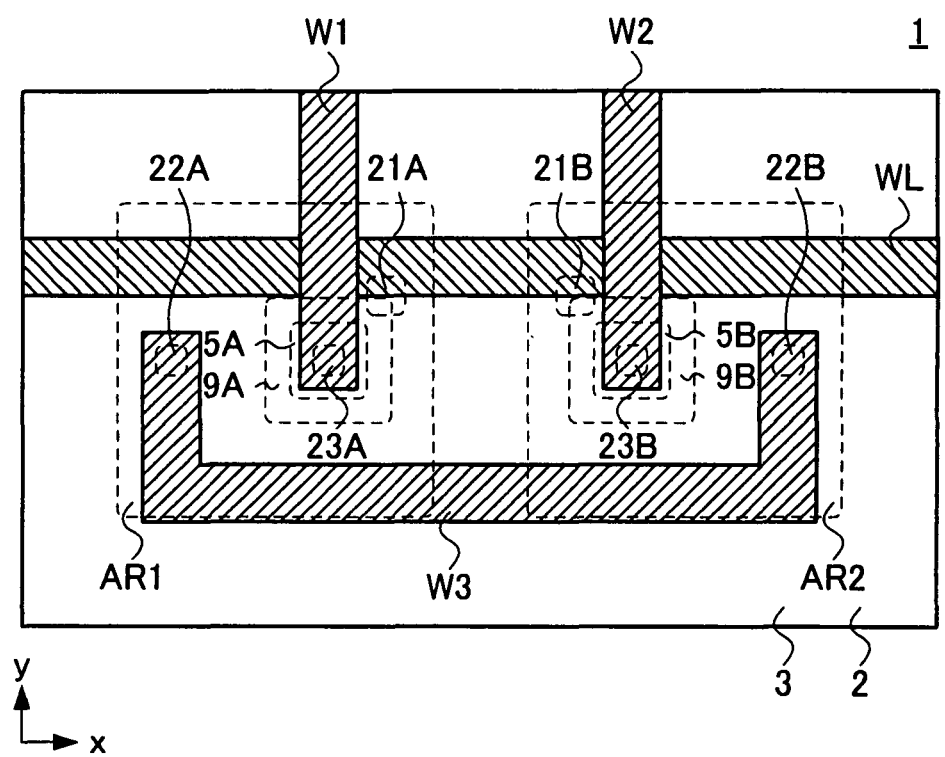
FIG. 12 is a top view of the semiconductor device according to a first modification of the third preferred embodiment of the present invention.

FIG. 12 is a top view illustrating the semiconductor device 1 according to a first modification of the third preferred embodiment of the present invention. Also in FIG. 12, the word line WL is transparently illustrated as in the case of FIG. 7. Some other internal structures are also transparently illustrated with broken lines.

In the present modification, the arrangements of the first to third wirings W1 to W3 are modified. Concretely, as illustrated in FIG. 12, the first wiring W1 is formed as a linear wiring contacting, at one end thereof, the third contact plug 23A and extending from the one end to one side (upper side of the drawing) in y-direction. Further, the second wiring W2 is formed as a linear wiring contacting, at one end thereof, the fourth contact plug 23B and extending from the one end to the one side (upper side of the drawing) in y-direction. Further, the third wiring W3 is formed as a wiring contacting, at one end thereof, the first contact plug 22A and contacting, at the other end thereof, the second contact plug 22B. The third wiring W3 is diverted to the other side (lower side in the drawing) in y-direction so as not to contact the first and second wirings W1 and W2.

According to the wiring arrangement of the present modification, the direction of the drain current flowing in each vertical transistor in each mode is reversed to that in the semiconductor device of the third embodiment; however, as in the case of the third embodiment, it is possible to provide a vertical type transistor in which the magnitude of the drain current does not change before and after the bias switching. Further, the first and second wirings W1 and W2 can be drawn in the same direction (one side in y-direction).

Figure 13:
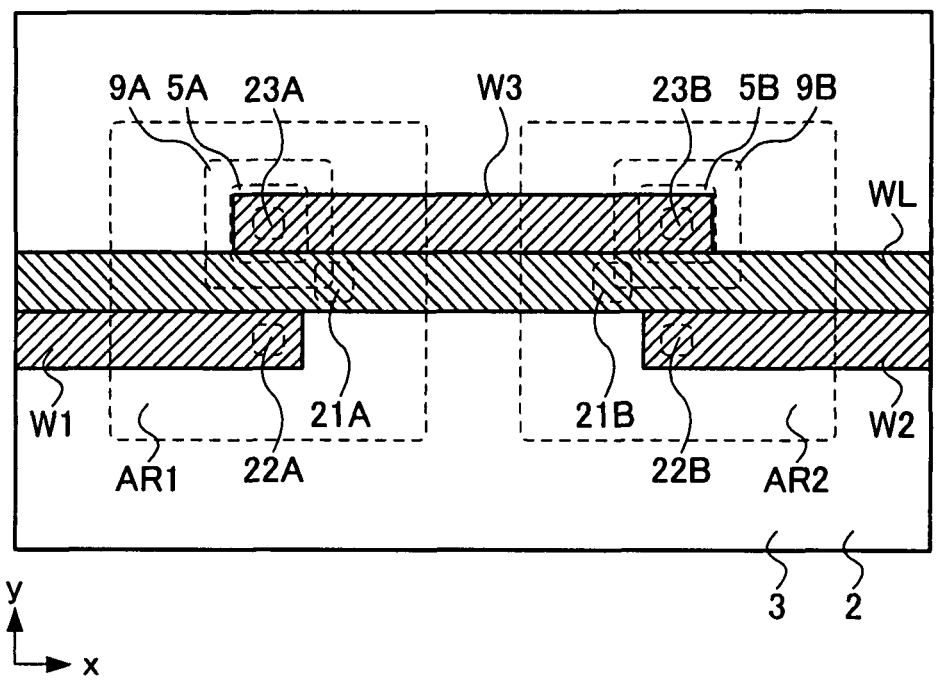
FIG. 13 is a top view of the semiconductor device according to a second modification of the third preferred embodiment of the present invention.

FIG. 13 is a top view illustrating the semiconductor device 1 according to a second modification of the third preferred embodiment of the present invention. Also in FIG. 13, the word line WL is transparently illustrated as in the case of FIG. 9. Some other internal structures are also transparently illustrated with broken lines.

In the present modification, both the first and second vertical type transistors 4A and 4B are arranged in their corresponding active areas in the same direction as the first vertical type transistor 4A of FIG. 6 (second embodiment). That is, with regard to the first vertical type transistor 4A, the first silicon pillar 5A is formed in the active region AR1 at the center thereof in x-direction and on one side (upper side of the drawing) thereof in y-direction. Similarly, the third contact plug 23A formed just above the first silicon pillar 5A is formed in the active region AR1 at the center thereof in x-direction and on the one side thereof in y-direction. The first contact plug 22A is formed in the active region AR1 at the center thereof in x-direction and on the other side (lower side of the drawing) thereof in y-direction. The gate contact plug 21A is formed at a position between the first and third contact plugs 22A and 23A as viewed in y-direction and not overlapping the first silicon pillar 5A as viewed from above.

The same arrangement is used for the second vertical type transistor 4B. That is, the second silicon pillar 5B is formed in the active region AR2 at the center thereof in x-direction and on one side (upper side of the drawing) thereof in y-direction. Similarly, the fourth contact plug 23B formed just above the second silicon pillar 5B is formed in the active region AR2 at the center thereof in x-direction and on the one side thereof in y-direction. The second contact plug 22B is formed in the active region AR2 at the center thereof in x-direction and on the other side (lower side of the drawing) thereof in y-direction. The gate contact plug 21B is formed at a position between the second and fourth contact plugs 22B and 23B as viewed in y-direction and not overlapping the second silicon pillar 513 as viewed from above.

The first and second contact plugs 22A and 22B are arranged in the same position in y-direction. Similarly, the third and fourth contact plugs 23A and 23B are arranged in the same position in y-direction. In addition, the gate contact plugs 21A and 21B are arranged in the same position in y-direction.

The shape of each of the first to third wirings W1 to W3 and a connecting state thereof to the corresponding contact plug are the same as those in the third embodiment (FIG. 9). That is, the first wiring W1 is a linear wiring contacting, at one end thereof, the first contact plug 22A and extending from the one end to the other side (left side in the drawing) in x-direction. The second wiring W2 is a linear wiring contacting, at one end thereof, the second contact plug 22B and extending from the one end to the one side (right side in the drawing) in x-direction. The third wiring W3 is a linear wiring contacting, at one end thereof, the third contact plug 23A and contacting, at the other end thereof, the fourth contact plug 23B.

The word line WL is arranged between the first and second wirings W1 and W2 as viewed from above as in the case of the word line WL of FIG. 6 (second embodiment).

With the configuration described above, the circuit diagram of the semiconductor device 1 of the present embodiment is the same as that of the semiconductor device 1 of the third embodiment of FIG. 11. Thus, as in the case of the semiconductor device 1 of the third embodiment, it is possible to provide a vertical type transistor in which the magnitude of the drain current does not change before and after the bias switching.

Figure 14:
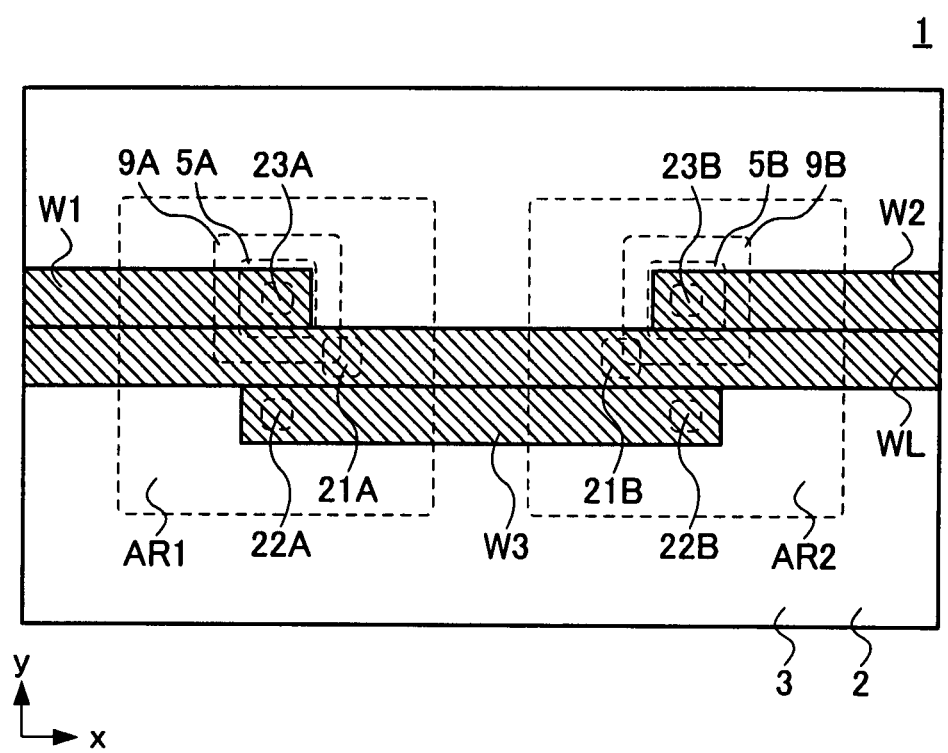
FIG. 14 is a top view of the semiconductor device according to a third modification of the third preferred embodiment of the present invention.

FIG. 14 is a top view illustrating the semiconductor device 1 according to a third modification of the third preferred embodiment of the present invention. Also in FIG. 14, the word line WL is transparently illustrated as in the case of FIG. 9. Some other internal structures are also transparently illustrated with broken lines.

The present modification differs from the second modification in a connection state between each of the first to third wirings W1 to W3 and corresponding contact plug. Concretely, the first wiring W1 is a linear wiring contacting, at one end thereof, the third contact plug 23A and extending from the one end to the other side (left side of the drawing) in x-direction. Further, the second wiring W2 is a linear wiring contacting, at one end thereof, the fourth contact plug 23B and extending from the one end to the one side (right side of the drawing) in x-direction. Further, the third wiring W3 is a linear wiring contacting, at one end thereof, the first contact plug 22A and contacting, at the other end thereof, the second contact plug 22B.

With the configuration described above, the electrical connection relationship between the vertical type transistors and wirings in the semiconductor device 1 is the same as that in the semiconductor device 1 of the first modification. Thus, as in the case of the semiconductor device 1 of the first modification, it is possible to provide a vertical type transistor in which the magnitude of the drain current does not change before and after the bias switching. Further, the wiring length of the third wiring W3 can be reduced as compared to that in the first modification, thereby allowing a reduction in wiring area.

It is apparent that the present invention is not limited to the above embodiments, but may be modified and changed without departing from the scope and spirit of the invention.

What is claimed is:

1. A semiconductor device comprising:
   a first vertical type transistor including:
      a first semiconductor pillar vertically formed on an upper surface of a semiconductor substrate;
      a first lower diffusion layer formed at a lower portion of or below the first semiconductor pillar;
      a first upper diffusion layer formed at an upper portion of the first semiconductor pillar;
      a first gate insulating film covering a side surface of the first semiconductor pillar; and
      a first gate electrode covering the first gate insulating film;
   a second vertical type transistor including:
      a second semiconductor pillar vertically formed on the upper surface of the semiconductor substrate;
      a second lower diffusion layer formed at a lower portion of or below the second semiconductor pillar;
      a second upper diffusion layer formed at an upper portion of the second semiconductor pillar;
      a second gate insulating film covering a side surface of the second semiconductor pillar; and
      a second gate electrode covering the second gate insulating film;
   a gate wiring electrically connected to the first and second gate electrodes;
   a first wiring electrically connected to the first lower diffusion layer and second upper diffusion layer; and
   a second wiring electrically connected to the first upper diffusion layer and second lower diffusion layer,
   wherein:
      the first and second vertical type transistors are electrically connected between first and second nodes,
      a length of a wiring extending from the first node to the first lower diffusion layer is substantially equal to a length of a wiring extending from the second node to the second lower diffusion layer, and
      a length of a wiring extending from the first node to the second upper diffusion layer is substantially equal to a length of a wiring extending from the second node to the first upper diffusion layer.

2. The semiconductor device as claimed in claim 1, wherein the first and second vertical type transistors have substantially a same characteristics.

3. The semiconductor device as claimed in claim 1, wherein the first and second vertical type transistors have a plane-symmetrical to each other with respect to a predetermine plane.

4. The semiconductor device as claimed in claim 1, wherein the first and second vertical type transistors are adjacently arranged.

5. The semiconductor device as claimed in claim 1, further comprising:
   an interlayer insulating film covering the first and second vertical type transistors;
   first and second contact plugs penetrating the interlayer insulating film and being electrically connected to the first and second lower diffusion layers, respectively; and
   third and fourth contact plugs penetrating the interlayer insulating film and being electrically connected to the first and second upper diffusion layers, respectively,
   wherein the first and second wiring are formed on an upper surface of the interlayer insulating film, the first wiring is electrically connected to the first lower diffusion layer through the first contact plug and electrically connected to the second upper diffusion layer through the fourth contact plug, and the second wiring is electrically connected to the first upper diffusion layer through the third contact plug and electrically connected to the second lower diffusion layer through the second contact plug.

6. The semiconductor device as claimed in claim 5, wherein the first wiring includes a first partial wiring having an end portion, a second partial wiring connected between the end portions of the first partial wiring and the first contact plug, and a third partial wiring connected between the end portions of the first partial wiring and the fourth contact plug, and the second wiring includes a fourth partial wiring having an end portion, a fifth partial wiring connected between the end portions of the fourth partial wiring and the third contact plug, and a sixth partial wiring connected between the end portions of the fourth partial wiring and the second contact plug.

7. The semiconductor device as claimed in claim 6, wherein the second partial wiring and sixth partial wiring have substantially a same length, and the third partial wiring and fifth partial wiring have substantially a same length.

8. The semiconductor device as claimed in claim 1, further comprising a bias switching circuit switching between a first mode in which voltage applied to the first wiring is higher than that applied to the second wiring and a second mode in which voltage applied to the second wiring is higher than that applied to the first wiring.

9. A semiconductor device comprising:
   a first vertical type transistor including:
      a first semiconductor pillar vertically formed on an upper surface of a semiconductor substrate;
      a first lower diffusion layer formed at a lower portion of or below the first semiconductor pillar;
      a first upper diffusion layer formed at an upper portion of the first semiconductor pillar;
      a first gate insulating film covering a side surface of the first semiconductor pillar; and
      a first gate electrode covering the first gate insulating film; and
   a second vertical type transistor including:
      a second semiconductor pillar vertically formed on the upper surface of the semiconductor substrate; a second lower diffusion layer formed at a lower portion of or below the second semiconductor pillar;
      a second upper diffusion layer formed at an upper portion of the second semiconductor pillar;
      a second gate insulating film covering a side surface of the second semiconductor pillar; and
      a second gate electrode covering the second gate insulating film, wherein:
   the first and second vertical type transistors are electrically connected in parallel between first and second nodes,
   the first node is electrically connected to the first lower diffusion layer and second upper diffusion layer,
   the second node is electrically connected to the first upper diffusion layer and second lower diffusion layer,
   a length of a wiring extending from the first node to the first lower diffusion layer is substantially equal to a length of a wiring extending from the second node to the second lower diffusion layer, and a length of a wiring extending from the first node to the second upper diffusion layer is substantially equal to a length of a wiring extending from the second node to the first upper diffusion layer.

10. The semiconductor device as claimed in claim 9, wherein the first and second vertical type transistors have substantially a same characteristics.

11. The semiconductor device as claimed in claim 9, further comprising a bias switching circuit switching between a first mode in which voltage applied to the first node is higher than that applied to the second node and a second mode in which voltage applied to the second node is higher than that applied to the first node.

12. A semiconductor device comprising:
a first vertical type transistor including:
a first semiconductor pillar vertically formed on an upper surface of a semiconductor substrate;
a first lower diffusion layer formed at a lower portion of or below the first semiconductor pillar;
a first upper diffusion layer formed at an upper portion of the first semiconductor pillar;
a first gate insulating film covering a side surface of the first semiconductor pillar; and a first gate electrode covering the first gate insulating film; and
a second vertical type transistor including:
a second semiconductor pillar vertically formed on the upper surface of the semiconductor substrate;
a second lower diffusion layer formed at a lower portion of or below the second semiconductor pillar;
a second upper diffusion layer formed at an upper portion of the second semiconductor pillar;
a second gate insulating film covering a side surface of the second semiconductor pillar; and
a second gate electrode covering the second gate insulating film,
wherein:
the first and second vertical type transistors are electrically connected in series between first and second nodes,
the first node is electrically connected to one of the first lower diffusion layer and the second upper diffusion layer,
the second node is electrically connected to the second lower diffusion layer when the first node is electrically connected to the first lower diffusion layer or electrically connected to the second upper diffusion layer when the first node is connected to the first upper diffusion layer,
a length of a wiring extending from the first node to the first lower diffusion layer is substantially equal to a length of a wiring extending from the second node to the second lower diffusion layer, and
a length of a wiring extending from the first node to the second upper diffusion layer is substantially equal to a length of a wiring extending from the second node to the first upper diffusion layer.

13. The semiconductor device as claimed in claim 12, wherein the first and second vertical type transistors have substantially a same characteristics.

14. The semiconductor device as claimed in claim 12, further comprising a bias switching circuit switching between a first mode in which voltage applied to the first node is higher than that applied to the second node and a second mode in which voltage applied to the second node is higher than that applied to the first node.

* * * * *